(12) United States Patent
Itasaka et al.

(10) Patent No.: US 9,484,857 B2
(45) Date of Patent: Nov. 1, 2016

(54) SEMICONDUCTOR CIRCUIT DEVICE, ELECTRONIC DEVICE, ELECTRONIC APPARATUS, AND MOVING OBJECT

(71) Applicant: Seiko Epson Corporation, Tokyo (JP)

(72) Inventors: Yosuke Itasaka, Tatsuno (JP); Masayuki Ishikawa, Suwa (JP); Takehiro Yamamoto, Suwa (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/534,656

(22) Filed: Nov. 6, 2014

(65) Prior Publication Data

US 2015/0123740 A1 May 7, 2015

(30) Foreign Application Priority Data

Nov. 7, 2013 (JP) .................................. 2013-231552

(51) Int. Cl.
*H03B 5/32* (2006.01)
*H03H 9/10* (2006.01)
(Continued)

(52) U.S. Cl.
CPC ............ *H03B 5/32* (2013.01); *H03H 9/02102* (2013.01); *H03H 9/0552* (2013.01); *H03H 9/1071* (2013.01); *H01L 23/528* (2013.01); *H01L 24/06* (2013.01); *H01L 24/16* (2013.01); *H01L 2224/0401* (2013.01); *H01L 2224/06135* (2013.01); *H01L 2224/06164* (2013.01); *H01L 2224/16225* (2013.01); *H01L 2924/1434* (2013.01); *H01L 2924/1461* (2013.01); *H01L 2924/1517* (2013.01); *H01L 2924/15153* (2013.01); *H01L 2924/15313* (2013.01); *H01L 2924/15323* (2013.01); *H01L 2924/16195* (2013.01)

(58) Field of Classification Search
CPC .. H03B 5/32; H03H 9/0552; H03H 9/02102; H03H 9/1071; B81C 1/00261; H01L 2924/1434; H01L 2224/06135; H01L 2924/1517; H01L 2924/16195; H01L 2924/15153; H01L 2924/15323; H01L 2924/1461; H01L 2224/06164; H01L 2224/16225; H01L 23/528; H01L 2224/0401; H01L 2924/15313; H01L 24/06; H01L 24/16
USPC .......... 331/66, 107 R, 116 R, 116 M, 108 C, 331/108 D, 154, 158, 176
See application file for complete search history.

(56) References Cited

U.S. PATENT DOCUMENTS 5,942,951 A * 8/1999 Brady ..................... G06F 1/182
331/108 C
6,512,680 B2 1/2003 Harada et al.
6,603,807 B1 8/2003 Yukutake et al.
6,836,152 B2 12/2004 Karasudani
(Continued)

FOREIGN PATENT DOCUMENTS

JP 05-048003 A 2/1993
JP 05-243472 A 9/1993
(Continued)

*Primary Examiner* — Richard Tan
(74) *Attorney, Agent, or Firm* — Harness, Dickey & Pierce, P.L.C.

(57) ABSTRACT

A semiconductor circuit device includes: a semiconductor substrate; and a first circuit block including an analog circuit as a component, a second circuit block including a digital circuit as a component, a connection pad, and a connection wire electrically connecting the connection pad with the first circuit block, all of which are arranged on the semiconductor substrate. The connection wire is provided so as not to overlap the second circuit block in a plan view.

16 Claims, 11 Drawing Sheets

(51) Int. Cl.
*H03H 9/02* (2006.01)
*H03H 9/05* (2006.01)
*H01L 23/528* (2006.01)
*H01L 23/00* (2006.01)

(56) References Cited

U.S. PATENT DOCUMENTS

| | | |
|---|---|---|
| 7,289,553 B2 | 10/2007 | Yukutake et al. |
| 7,522,692 B2 | 4/2009 | Yukutake et al. |
| 2002/0063608 A1* | 5/2002 | Sutliff ................ H03B 5/04 331/108 D |
| 2007/0121575 A1* | 5/2007 | Savry ................ G06K 19/073 370/351 |
| 2010/0007029 A1* | 1/2010 | Do ................ H01L 21/568 257/774 |
| 2011/0254131 A1* | 10/2011 | Itagaki ................ H01L 27/0203 257/533 |
| 2013/0038400 A1 | 2/2013 | Asamura |

FOREIGN PATENT DOCUMENTS

| | | |
|---|---|---|
| JP | 10-065105 A | 3/1998 |
| JP | 11-097613 A | 4/1999 |
| JP | 11-317445 A | 11/1999 |
| JP | 2000-150802 A | 5/2000 |
| JP | 2002-009262 A | 1/2002 |
| JP | 2002-110914 A | 4/2002 |
| JP | 2002-313980 A | 10/2002 |
| JP | 2003-037172 A | 2/2003 |
| JP | 2006-054269 A | 2/2006 |
| JP | 2012-160613 A | 8/2012 |
| JP | 2013-038737 A | 2/2013 |

\* cited by examiner

SEMICONDUCTOR CIRCUIT DEVICE, ELECTRONIC DEVICE, ELECTRONIC APPARATUS, AND MOVING OBJECT

BACKGROUND

1. Technical Field

The present invention relates to a semiconductor circuit device, an electronic device, an electronic apparatus, and a moving object.

2. Related Art

Oscillators using a vibrator such as a quartz crystal resonator (piezoelectric vibrator) or a MEMS (Micro Electro Mechanical Systems) vibrator are known. In many of these oscillators, a configuration including a memory circuit that stores various kinds of setting information is adopted in addition to an oscillation circuit.

JP-A-2006-54269 discloses a configuration for improving a characteristic degradation such as phase noise due to interference between a DC (direct current) circuit block and an AC (alternating current) circuit block located in an analog circuit block. To accomplish this, the DC circuit block and the AC circuit block in the analog circuit block are arranged separate from each other and a digital circuit block, such as for a memory, is arranged therebetween.

JP-A-2003-37172 discloses a configuration in which a layout in an IC chip is divided into an analog circuit area and a digital circuit area. This reduces the influence of noise generated by interference between the digital circuit and the analog circuit.

In JP-A-2006-54269, the interference between the DC circuit block and the AC circuit block in the analog circuit block can be reduced, but there is a risk of causing a malfunction of a memory or the like as a digital circuit due to interference between the analog circuit and the digital circuit.

In JP-A-2003-37172, since connection pads and a wiring arrangement between the connection pads and the analog circuit area are not considered, interference may be generated between the analog circuit area and the digital circuit area depending on the arrangement of the wires. Moreover, since an arrangement of the connection pads is not considered, it may be difficult to secure one large rectangular area. As a result, for example, when the digital circuit is a memory circuit generally formed in a rectangular area, the chip size should be made large for securing a desired storage capacity, or the memory circuit could be arranged in a plurality of areas. When the memory circuit is arranged in a plurality of areas, the connection and addressing of the memory circuit become complicated.

SUMMARY

An advantage of some aspects of the invention is to provide a semiconductor circuit device, an electronic device, an electronic apparatus, and a moving object, all of which suppress interference between a connection wire and a circuit block.

APPLICATION EXAMPLE 1

A semiconductor circuit device according to this application example includes: a semiconductor substrate; and a first circuit block including an analog circuit as a component, a second circuit block including a digital circuit as a component, a connection pad, and a connection wire electrically connecting the connection pad with the first circuit block, all of which are arranged on the semiconductor substrate, wherein the connection wire does not overlap the second circuit block in a plan view.

According to this application example, since the connection wire electrically connected with the first circuit block including an analog circuit as a component is provided so as not to overlap the second circuit block including a digital circuit as a component in the plan view, it is possible to realize the semiconductor circuit device capable of suppressing interference between the connection wire and the second circuit block.

APPLICATION EXAMPLE 2

In the semiconductor circuit device according to the application example described above, it is preferable that the connection pad is provided between the first circuit block and the second circuit block in the plan view.

According to this application example, since the connection pad and the first circuit block can be arranged close to each other, the connection wire can be shortened. Therefore, it is possible to realize the semiconductor circuit device capable of further suppressing the interference between the connection wire and the second circuit block.

APPLICATION EXAMPLE 3

In the semiconductor circuit device according to the application example described above, it is preferable that at least a portion of the connection pad is arranged in a recessed area of the first circuit block in the plan view.

According to this application example, since a circuit that is likely to be an interference source in the first circuit block, for example, an oscillation circuit or the like, and the connection pad can be arranged closer to each other, the connection wire can be further shortened. Therefore, it is possible to realize the semiconductor circuit device capable of further suppressing the interference between the connection wire and the second circuit block even when the size of the semiconductor substrate cannot be made large.

APPLICATION EXAMPLE 4

In the semiconductor circuit device according to the application example described above, it is preferable that the second circuit block includes a memory circuit.

According to this application example, it is possible to realize the semiconductor circuit device capable of suppressing interference between the memory circuit whose memory content may change under interference and the connection wire.

APPLICATION EXAMPLE 5

In the semiconductor circuit device according to the application example described above, it is preferable that the first circuit block includes an oscillation circuit electrically connected with the connection wire.

According to this application example, it is possible to realize the semiconductor circuit device capable of suppressing interference between the oscillation circuit that is likely to be an interference source and the second circuit block.

APPLICATION EXAMPLE 6

In the semiconductor circuit device according to the application example described above, it is preferable that the connection pad is electrically connected with a terminal to which an oscillation signal is output from the oscillation circuit.

According to this application example, it is possible to realize the semiconductor circuit device capable of suppressing interference between the output terminal of the oscillation circuit that is likely to be an interference source and the second circuit block.

APPLICATION EXAMPLE 7

In the semiconductor circuit device according to the application example described above, it is preferable that the connection pad is an electrode electrically connected with a resonator.

According to this application example, it is possible to realize the semiconductor circuit device capable of suppressing interference between the electrode electrically connected with the resonator that is likely to be an interference source and the second circuit block.

APPLICATION EXAMPLE 8

An electronic device according to this application example includes any of the semiconductor circuit devices according to the application examples described above.

According to this application example, since the semiconductor circuit device capable of suppressing the interference between the connection wire and the second circuit block is included, it is possible to realize the electronic device, for example, an oscillator, a sensor, or the like, having high operational reliability.

APPLICATION EXAMPLE 9

A semiconductor circuit device according to this application example includes: a semiconductor substrate; and a first circuit block including an analog circuit as a component, a second circuit block including a digital circuit as a component, and a first connection pad, all of which are arranged on the semiconductor substrate, wherein the first connection pad is provided between the first circuit block and the second circuit block in a plan view.

According to this application example, since the first connection pad is provided between the first circuit block and the second circuit block in the plan view, one large rectangular area can be secured in the second circuit block. Therefore, even when the size of the semiconductor substrate cannot be made large, one rectangular area in the second circuit block is made large, so that, for example, a large area can be secured for forming a circuit having one function. Therefore, it is possible to realize the semiconductor circuit device allowing great flexibility in circuit arrangement.

APPLICATION EXAMPLE 10

In the semiconductor circuit device according to the application example described above, it is preferable that at least a portion of the first connection pad is arranged in a recessed area of the first circuit block in the plan view.

According to this application example, since the first connection pad is arranged so as to cut into the first circuit block in the plan view, a large arrangement area can be secured for the second circuit block. Therefore, one larger rectangular area can be secured in the second circuit block. Therefore, even when the size of the semiconductor substrate cannot be made large, one rectangular area in the second circuit block is made large, so that, for example, a large area can be secured for forming a circuit having one function. Therefore, it is possible to realize the semiconductor circuit device allowing great flexibility in circuit arrangement.

APPLICATION EXAMPLE 11

In the semiconductor circuit device according to the application example described above, it is preferable that the semiconductor circuit device further includes a second connection pad, and that the second connection pad is provided between the first circuit block and the second circuit block in the plan view.

According to this application example, since the second connection pad is provided between the first circuit block and the second circuit block in the plan view, one larger rectangular area can be secured in the second circuit block. Therefore, even when the size of the semiconductor substrate cannot be made large, one rectangular area in the second circuit block is made larger, so that, for example, a large area can be secured for forming a circuit having one function. Therefore, it is possible to realize the semiconductor circuit device allowing great flexibility in circuit arrangement.

APPLICATION EXAMPLE 12

In the semiconductor circuit device according to the application example described above, it is preferable that the second circuit block is provided between an edge portion of the semiconductor substrate and the first circuit block and between the edge portion and the first connection pad.

According to this application example, compared to the case where the first connection pad is provided in the vicinity of the edge portion of the semiconductor substrate, one large rectangular area can be secured in the second circuit block arranged on the edge portion side of the semiconductor substrate. Therefore, even when the size of the semiconductor substrate cannot be made large, one rectangular area in the second circuit block is made large, so that, for example, a large area can be secured for forming a circuit having one function. Therefore, it is possible to realize the semiconductor circuit device allowing great flexibility in circuit arrangement.

APPLICATION EXAMPLE 13

In the semiconductor circuit device according to the application example described above, it is preferable that the semiconductor circuit device further includes a second connection pad, and that the second circuit block is provided between the edge portion and the second connection pad in the plan view.

According to this application example, one larger rectangular area can be secured in the second circuit block arranged on the edge portion side of the semiconductor substrate. Therefore, even when the size of the semiconductor substrate cannot be made large, one rectangular area in the second circuit block is made large, so that, for example, a large area can be secured for forming a circuit having one function. Therefore, it is possible to realize the semiconductor circuit device allowing great flexibility in circuit arrangement.

APPLICATION EXAMPLE 14

In the semiconductor circuit device according to the application example described above, it is preferable that the second circuit block includes a memory circuit.

According to this application example, since the memory circuit can be arranged in one rectangular area in the second circuit block, it is possible to realize the semiconductor circuit device capable of increasing the storage capacity of the memory circuit even when the size of the semiconductor substrate cannot be made large. Moreover, since the memory circuit can be arranged in one rectangular area, the wiring of the memory circuit is facilitated compared to the case where the memory circuit is provided in a plurality of areas. Moreover, compared to the case where the memory circuit is provided in a plurality of areas, addressing of the memory circuit is facilitated.

APPLICATION EXAMPLE 15

An electronic device according to this application example includes any of the semiconductor circuit devices according to the application examples described above.

According to this application example, the semiconductor circuit device allowing great flexibility in circuit arrangement is included. The semiconductor circuit device allows the great flexibility because even when the size of the semiconductor substrate cannot be made large, one rectangular area in the second circuit block is made large, so that, for example, a large area can be secured for forming a circuit having one function. Therefore, it is possible to realize the electronic device, for example, an oscillator, a sensor, or the like, suitable for miniaturization.

APPLICATION EXAMPLE 16 AND APPLICATION EXAMPLE 17

An electronic apparatus according to these application examples includes any of the semiconductor circuit devices according to the application examples described above.

APPLICATION EXAMPLE 18 AND APPLICATION EXAMPLE 19

A moving object according to these application examples includes any of the semiconductor circuit devices according to the application examples described above.

According to the electronic apparatus and the moving object according to these application examples, since the semiconductor circuit device capable of suppressing the interference between the circuit block and the connection wire is included, it is possible to realize the electronic apparatus and the moving object having high operational reliability. Moreover, the semiconductor circuit device allowing great flexibility in circuit arrangement is included. The semiconductor circuit device allows the great flexibility because even when the size of the semiconductor substrate cannot be made large, one rectangular area in the second circuit block is made large, so that, for example, a large area can be secured for forming a circuit having one function. Therefore, it is possible to realize the electronic apparatus and the moving object suitable for miniaturization.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

Hereinafter, preferred embodiments of the invention will be described in detail with reference to the drawings. The drawings referred to are for descriptive purposes. The embodiments described below do not unduly limit the contents of the invention set forth in the appended claims. Moreover, not all of the configurations described below are necessarily essential configuration requirements of the invention.

1. Semiconductor Circuit Device

Hereinafter, as an example of a semiconductor circuit device, the case where a circuit for a voltage-controlled temperature-compensated crystal oscillator is formed on a semiconductor substrate will be described by way of example. However, the semiconductor circuit device according to the invention is not limited to this case, and can be applied to various circuits.

1-1. First Embodiment

Figure 1:
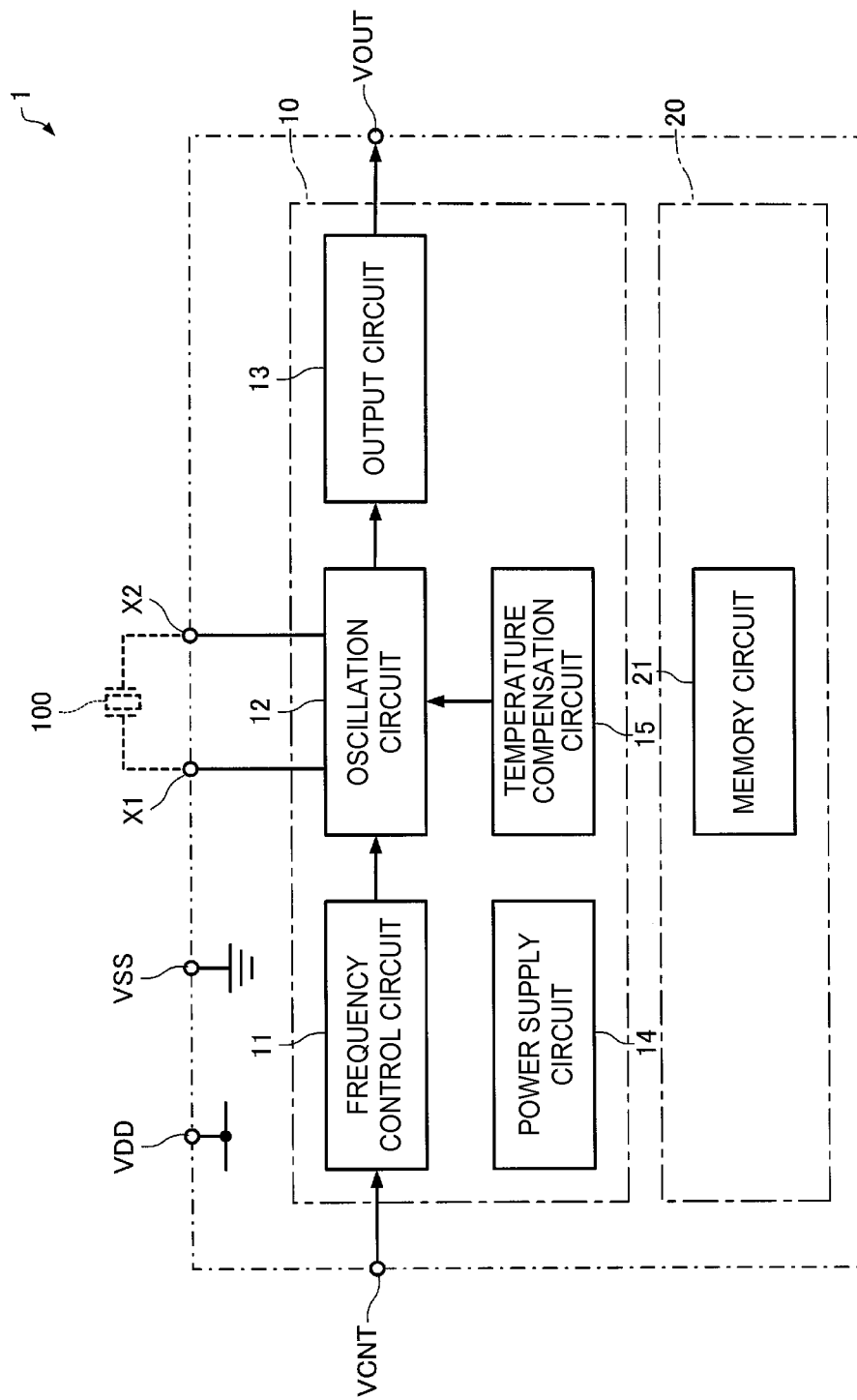
FIG. 1 is a circuit diagram showing an example of a semiconductor circuit device according to an embodiment.

FIG. 1 is a circuit diagram showing an example of a semiconductor circuit device 1 according to this embodiment.

The semiconductor circuit device 1 according to the embodiment is configured to include a first circuit block 10 including an analog circuit as a component, a second circuit block 20 including a digital circuit as a component, a connection pad VDD, a connection pad VSS, a connection pad VCNT, a connection pad VOUT, a connection pad X1, and a connection pad X2.

In the embodiment, the first circuit block 10 is composed mainly of analog circuits, but may include a portion of one or more digital circuits. In the example shown in FIG. 1, the first circuit block 10 is configured to include a frequency control circuit 11, an oscillation circuit 12, an output circuit 13, a power supply circuit 14, and a temperature compensation circuit 15.

In the embodiment, the second circuit block 20 is composed mainly of digital circuits, but may include a portion of one or more analog circuits. In the example shown in FIG. 1, the second circuit block 20 is configured to include a memory circuit 21.

The frequency control circuit 11 controls, based on a control signal input from the connection pad VCNT, the frequency of the oscillation circuit 12.

The oscillation circuit 12 is connected with a vibrator 100 and performs oscillation operation. In the example shown in FIG. 1, the oscillation circuit 12 is electrically connected with the vibrator 100 via the connection pad X1 and the connection pad X2. As the oscillation circuit 12, various kinds of publicly known oscillation circuits such as an inverter-type oscillation circuit, a Colpitts-type oscillation circuit, and a Hartley oscillation circuit can be adopted.

The output circuit 13 receives an oscillation signal output by the oscillation circuit 12, and outputs the signal to the connection pad VOUT. The output circuit 13 may be, for example, an output buffer circuit.

The power supply circuit 14 is supplied with power from the connection pad VDD and the connection pad VSS, and supplies desired power to the other circuits of the semiconductor circuit device 1.

The temperature compensation circuit 15 is a circuit for compensating the temperature characteristics of the vibrator 100. The temperature compensation circuit 15 may control, based on information stored in the memory circuit 21, the frequency of the oscillation circuit 12.

The memory circuit 21 stores various kinds of information. In the embodiment, the memory circuit 21 stores information used by the temperature compensation circuit 15. As the memory circuit 21, it is possible to adopt, for example, various kinds of publicly known nonvolatile memories including a rewritable nonvolatile memory such as an EEPROM (Electrically Erasable Programmable Read-Only Memory) or a flash memory, a non-rewritable non-volatile memory such as a mask ROM (Read-Only Memory), and a FAMOS (Floating gate Avalanche injection Metal Oxide Semiconductor) memory that is electrically non-rewritable but is erasable with irradiation of ultraviolet radiation, and various kinds of publicly known volatile memories such as a DRAM (Dynamic Random Access Memory) or an SRAM (Static Random Access Memory).

The connection pad VDD is a connection pad supplied with a power supply potential from the outside. The connection pad VSS is a connection pad supplied with a ground potential from the outside. The connection pad VCNT is a connection pad supplied with a control signal from the outside. The connection pad VOUT is a connection pad to output a signal to the outside. The connection pad X1 and the connection pad X2 are connection pads electrically connected with the vibrator 100.

Figure 2:
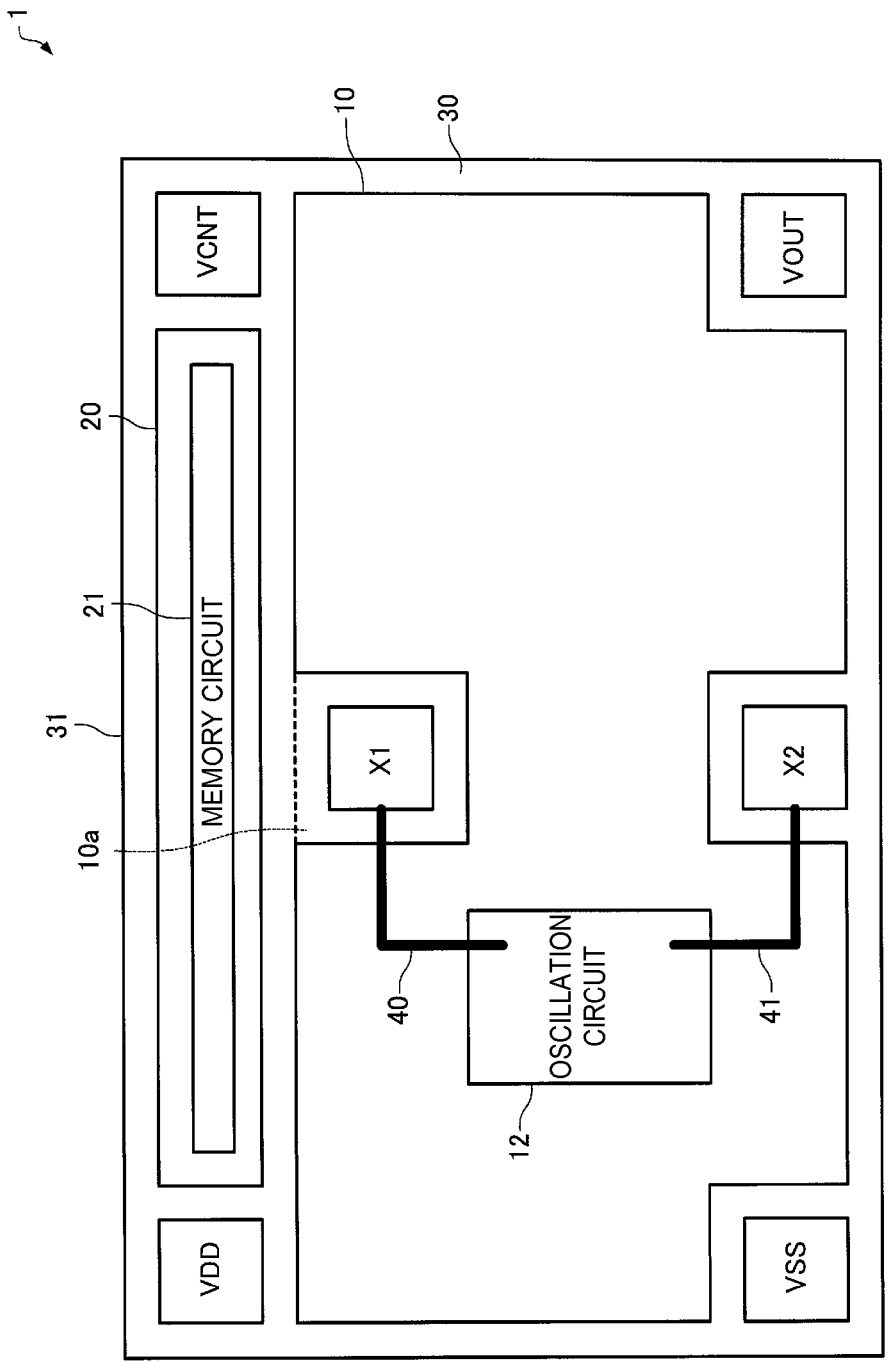
FIG. 2 is a plan view schematically showing the layout of the semiconductor circuit device according to the embodiment.

FIG. 2 is a plan view schematically showing the layout of the semiconductor circuit device 1 according to the embodiment. In FIG. 2, portions of the circuits included in the first circuit block 10 and the second circuit block 20 are not illustrated.

The semiconductor circuit device 1 according to the embodiment includes a semiconductor substrate 30, and the first circuit block 10 including an analog circuit as a component, the second circuit block 20 including a digital circuit as a component, the connection pad X1, and a connection wire 40 electrically connecting the connection pad X1 with the first circuit block 10, all of which are arranged on the semiconductor substrate 30. The connection wire 40 is provided so as not to overlap the second circuit block 20 (i.e., the connection wire 40 is spaced apart (e.g., laterally offset) from a periphery of the second circuit block 20) in a plan view.

The semiconductor substrate 30 is made of, for example, various kinds of publicly known semiconductor materials such as Si or GaAs. In the example shown in FIG. 2, the semiconductor substrate 30 is provided with the first circuit block 10, the second circuit block 20, the connection pad VDD, the connection pad VSS, the connection pad VCNT, the connection pad VOUT, the connection pad X1, the connection pad X2, the connection wire 40, and a connection wire 41.

The connection wire 40 and the connection wire 41 are made of, for example, various kinds of publicly known conductive materials such as Al, Cu, polysilicon, or an alloy including Al, Cu, or polysilicon as a main component. In the example shown in FIG. 2, the connection wire 40 is a wire electrically connecting the connection pad X1 with the oscillation circuit 12 of the first circuit block 10. In the example shown in FIG. 2, the connection wire 41 is a wire electrically connecting the connection pad X2 with the oscillation circuit 12 of the first circuit block 10.

According to the embodiment, since the connection wire 40 electrically connected with the first circuit block 10 including an analog circuit as a component is provided so as not to overlap the second circuit block 20 including a digital circuit as a component in the plan view, it is possible to realize the semiconductor circuit device 1 capable of suppressing interference between the connection wire 40 and the second circuit block 20.

In the embodiment, the connection pad X1 is provided between the first circuit block 10 and the second circuit block 20 in the plan view. In the example shown in FIG. 2, the connection pad X1 is provided at a position where the connection pad X1 is nearly surrounded by the first circuit block 10 and the second circuit block 20 in the plan view (e.g., about ¾ of the periphery of the connection pad X1 is adjacent to the first circuit block 10).

According to the embodiment, since the connection pad X1 and the first circuit block 10 can be arranged close to each other, the connection wire 40 can be shortened. Therefore, it is possible to realize the semiconductor circuit device 1 capable of further suppressing the interference between the connection wire 40 and the second circuit block 20.

In the embodiment, the semiconductor circuit device 1 includes a recessed area 10a (a notch) in the first circuit block 10 that is recessed in a direction away from the second circuit block 20 side in the plan view, and at least a portion of the connection pad X1 is provided in the recessed area 10a in the first circuit block 10. In the example shown in FIG. 2, the recessed area 10a in the first circuit block 10 is an area where a circuit element other than the connection pad X1 and the wire is not formed. In the example shown in FIG. 2, the entire connection pad X1 is provided in the recessed area 10a in the first circuit block 10 in the plan view.

According to the embodiment, since a circuit that is likely to be an interference source in the first circuit block 10, for example, the oscillation circuit 12, and the connection pad are arranged closer to each other, the connection wire 40 can be further shortened. Therefore, it is possible to realize the semiconductor circuit device 1 capable of further suppressing the interference between the connection wire 40 and the second circuit block 20. Moreover, since one large rectangular area can be secured in the second circuit block 20, even when the size of the semiconductor substrate 30 cannot be made large, it is also possible to realize the semiconductor circuit device 1 allowing great flexibility in circuit arrangement in the second circuit block 20.

In the embodiment, the second circuit block 20 is configured to include the memory circuit 21.

According to the embodiment, it is possible to realize the semiconductor circuit device 1 capable of suppressing interference between the memory circuit 21 whose memory content may change under interference and the connection wire 40.

In the embodiment, the first circuit block 10 is configured to include the oscillation circuit 12 electrically connected with the connection wire 40.

According to the embodiment, it is possible to realize the semiconductor circuit device 1 capable of suppressing interference between the oscillation circuit 12 that is likely to be an interference source and the second circuit block 20.

In the embodiment, the connection pad X1 is electrically connected with a terminal to which an oscillation signal from the oscillation circuit 12 is output. The oscillation signal output from the oscillation circuit 12 is an AC signal of large voltage amplitude, and therefore likely to be an interference source.

According to the embodiment, it is possible to realize the semiconductor circuit device 1 capable of suppressing interference between the output terminal of the oscillation circuit 12 that is likely to be an interference source and the second circuit block 20.

In the embodiment, the connection pad X1 is an electrode electrically connected with the vibrator 100. A signal passing through the electrode electrically connected with the vibrator 100 is an AC signal of large voltage amplitude, and therefore likely to be an interference source.

According to the embodiment, it is possible to realize the semiconductor circuit device 1 capable of suppressing interference between the electrode electrically connected with the vibrator 100 that is likely to be an interference source and the second circuit block 20.

The semiconductor circuit device 1 according to the embodiment has a further technical significance from a different viewpoint from that of the above-described technical significance.

The semiconductor circuit device 1 according to the embodiment includes the semiconductor substrate 30, and the first circuit block 10 including an analog circuit as a component, the second circuit block 20 including a digital circuit as a component, and the connection pad X1 (an example of a first connection pad), all of which are arranged on the semiconductor substrate 30. The connection pad X1 is provided between the first circuit block 10 and the second circuit block 20 in the plan view.

According to the embodiment, since the connection pad X1 is provided between the first circuit block 10 and the second circuit block 20 in the plan view, one large rectangular area can be secured in the second circuit block 20. Therefore, even when the size of the semiconductor substrate 30 cannot be made large, one rectangular area in the second circuit block 20 is made large, so that, for example, a large area can be secured for forming a circuit having one function. Therefore, it is possible to realize the semiconductor circuit device 1 allowing great flexibility in circuit arrangement.

In the embodiment, the semiconductor circuit device 1 includes the recessed area 10a in the first circuit block 10 that is recessed in the direction away from the second circuit block 20 side in the plan view. At least a portion of the connection pad X1 is provided in the recessed area 10a in the first circuit block 10.

According to the embodiment, since the connection pad X1 is arranged so as to cut into the first circuit block 10 in the plan view, a large arrangement area can be secured for the second circuit block 20. Therefore, one larger rectangular area can be secured in the second circuit block 20. Therefore, even when the size of the semiconductor substrate 30 cannot be made large, one rectangular area in the second circuit block 20 is made large, so that, for example, a large area can be secured for forming a circuit having one function. Therefore, it is possible to realize the semiconductor circuit device 1 allowing great flexibility in circuit arrangement.

In the embodiment, the second circuit block 20 is provided between an edge portion 31 of the semiconductor substrate 30 and the first circuit block 10 and between the edge portion 31 and the connection pad X1. In the example shown in FIG. 2, the semiconductor substrate 30 is configured to have an oblong shape in the plan view, and the edge portion 31 corresponds to one side of the oblong shape in the plan view. It is not necessary for the semiconductor substrate 30 to have a perfect polygonal shape in the plan view. The semiconductor substrate 30 may have a substantially polygonal shape with irregularities at the edge in the plan view. In this case, the edge portion 31 may correspond to a portion that can be regarded as one side of the substantially polygonal shape.

According to the embodiment, compared to the case where the connection pad X1 is provided in the vicinity of the edge portion 31 of the semiconductor substrate 30, one large rectangular area can be secured in the second circuit block 20 arranged on the edge portion 31 side of the semiconductor substrate 30. Therefore, even when the chip size of the semiconductor circuit device 1 cannot be made large, one rectangular area in the second circuit block 20 is made large, so that, for example, a large area can be secured for forming a circuit having one function. Therefore, it is possible to realize the semiconductor circuit device 1 allowing great flexibility in circuit arrangement.

In the embodiment, the second circuit block 20 is configured to include the memory circuit 21.

According to the embodiment, since the memory circuit 21 can be arranged in one rectangular area in the second circuit block 20, even when the size of the semiconductor substrate 30 cannot be made large, it is possible to realize the semiconductor circuit device 1 capable of increasing the storage capacity of the memory circuit 2. Moreover, since the memory circuit 21 can be arranged in one rectangular area, the wiring of the memory circuit 21 is facilitated compared to the case where the memory circuit 21 is provided in a plurality of areas. Moreover, compared to the case where the memory circuit 21 is provided in a plurality of areas, the addressing of the memory circuit 21 is facilitated.

In the embodiment, the second circuit block 20 is provided so as to be along the long side of the semiconductor substrate 30. This makes it possible to shorten wires between the memory circuit 21 of the second circuit block 20 and various circuits included in the first circuit block 10 compared to the case where the second circuit block 20 is provided so as to be along the short side of the semiconductor substrate 30.

1-2. Second Embodiment

Figure 3:
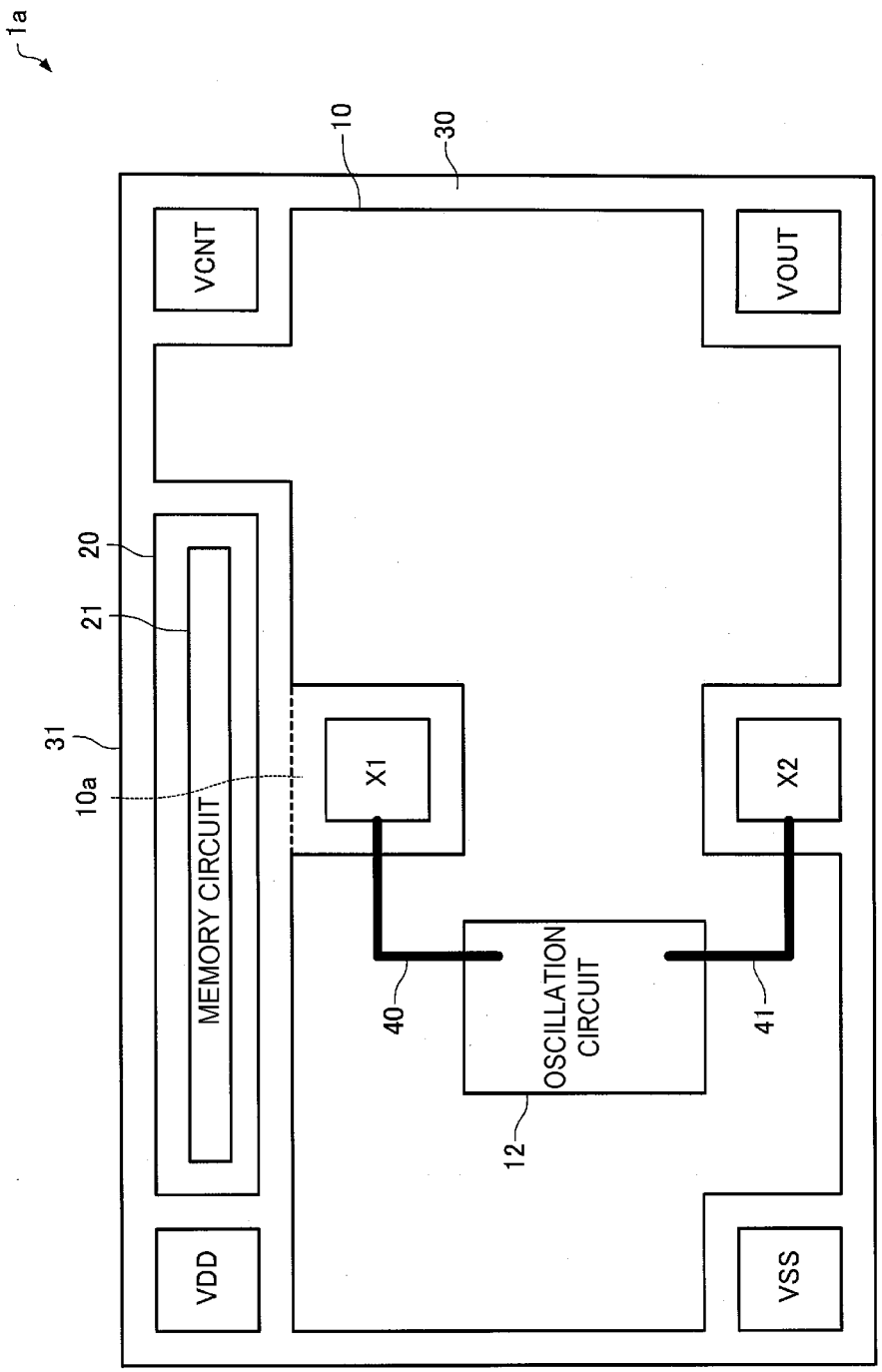
FIG. 3 is a plan view schematically showing the layout of a semiconductor circuit device according to an embodiment.

FIG. 3 is a plan view schematically showing the layout of a semiconductor circuit device 1a according to this embodiment. The circuit configuration of the semiconductor circuit device 1a is the same as the circuit configuration shown in FIG. 1. In FIG. 3, portions of circuits included in the first circuit block 10 and the second circuit block 20 are not illustrated.

In the example shown in FIG. 2, the connection pad VDD, the second circuit block 20, and the connection pad VCNT are provided in this order so as to be along the long side (the edge portion 31) of the semiconductor substrate 30. In the example shown in FIG. 3, however, the connection pad VDD, the second circuit block 20, the first circuit block 10, and the connection pad VCNT are provided in this order so as to be along the long side (the edge portion 31) of the semiconductor substrate 30. That is, in the example shown in FIG. 3, a portion of the first circuit block 10 is provided to jut out or project so as to be close to the edge portion 31.

Also in the semiconductor circuit device 1a shown in FIG. 3, advantageous effects similar to those of the semiconductor circuit device 1 according to the first embodiment are provided for reasons similar to those thereof.

1-3. Third Embodiment

Figure 4:
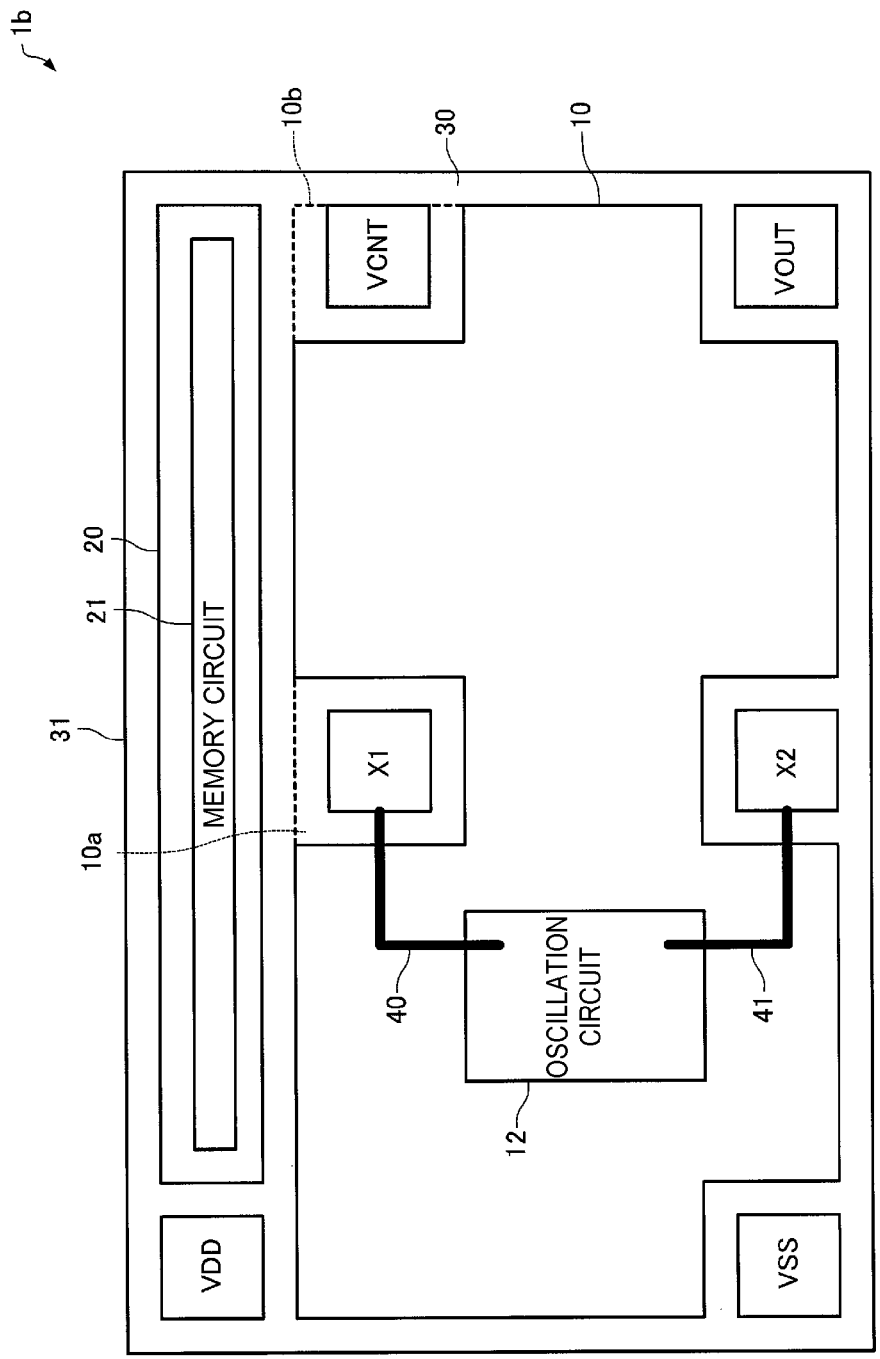
FIG. 4 is a plan view schematically showing the layout of a semiconductor circuit device according to an embodiment.

FIG. 4 is a plan view schematically showing the layout of a semiconductor circuit device 1b according to this embodiment. The circuit configuration of the semiconductor circuit device 1b is the same as the circuit configuration shown in FIG. 1. In FIG. 4, portions of circuits included in the first circuit block 10 and the second circuit block 20 are not illustrated.

In the embodiment, the connection pad VCNT (an example of a second connection pad) is included, and the second circuit block 20 is provided between the edge portion 31 and the first circuit block 10 and between the edge portion 31 and the connection pad VCNT (an example of the second connection pad) in the plan view. Moreover, the second circuit block 20 is provided between the edge portion 31 and the connection pad X1 in the plan view.

According to the embodiment, one rectangular area much larger than that of the first embodiment can be secured in the second circuit block 20 arranged on the edge portion 31 side of the semiconductor substrate 30. Therefore, even when the size of the semiconductor substrate 30 cannot be made large, one rectangular area in the second circuit block 20 is made large, so that, for example, a large area can be secured for forming the memory circuit 21. Therefore, it is possible to realize the semiconductor circuit device 1b allowing great flexibility in circuit arrangement.

In the embodiment, the semiconductor circuit device 1b includes a recessed area 10b (a notch) in the first circuit block 10 that is recessed in the direction away from the second circuit block 20 side in the plan view. At least a portion of the connection pad VCNT is provided in the recessed area 10b in the first circuit block 10. In the example shown in FIG. 4, the recessed area 10b in the first circuit block 10 is an area where a circuit element other than the connection pad VCNT and a wire is not formed. Moreover, in the example shown in FIG. 4, the entire connection pad VCNT is provided in the recessed area 10b in the first circuit block 10 in the plan view.

According to the embodiment, one rectangular area much larger than that of the first embodiment can be secured in the second circuit block 20. Therefore, even when the size of the semiconductor substrate 30 cannot be made large, one rectangular area in the second circuit block 20 is made large, so that, for example, a large area can be secured for forming the memory circuit 21. Therefore, it is possible to realize the semiconductor circuit device 1b allowing great flexibility in circuit arrangement.

Also in the semiconductor circuit device 1b shown in FIG. 4, advantageous effects similar to those of the semiconductor circuit device 1 according to the first embodiment are provided for reasons similar to those thereof.

1-4. Fourth Embodiment

Figure 5:
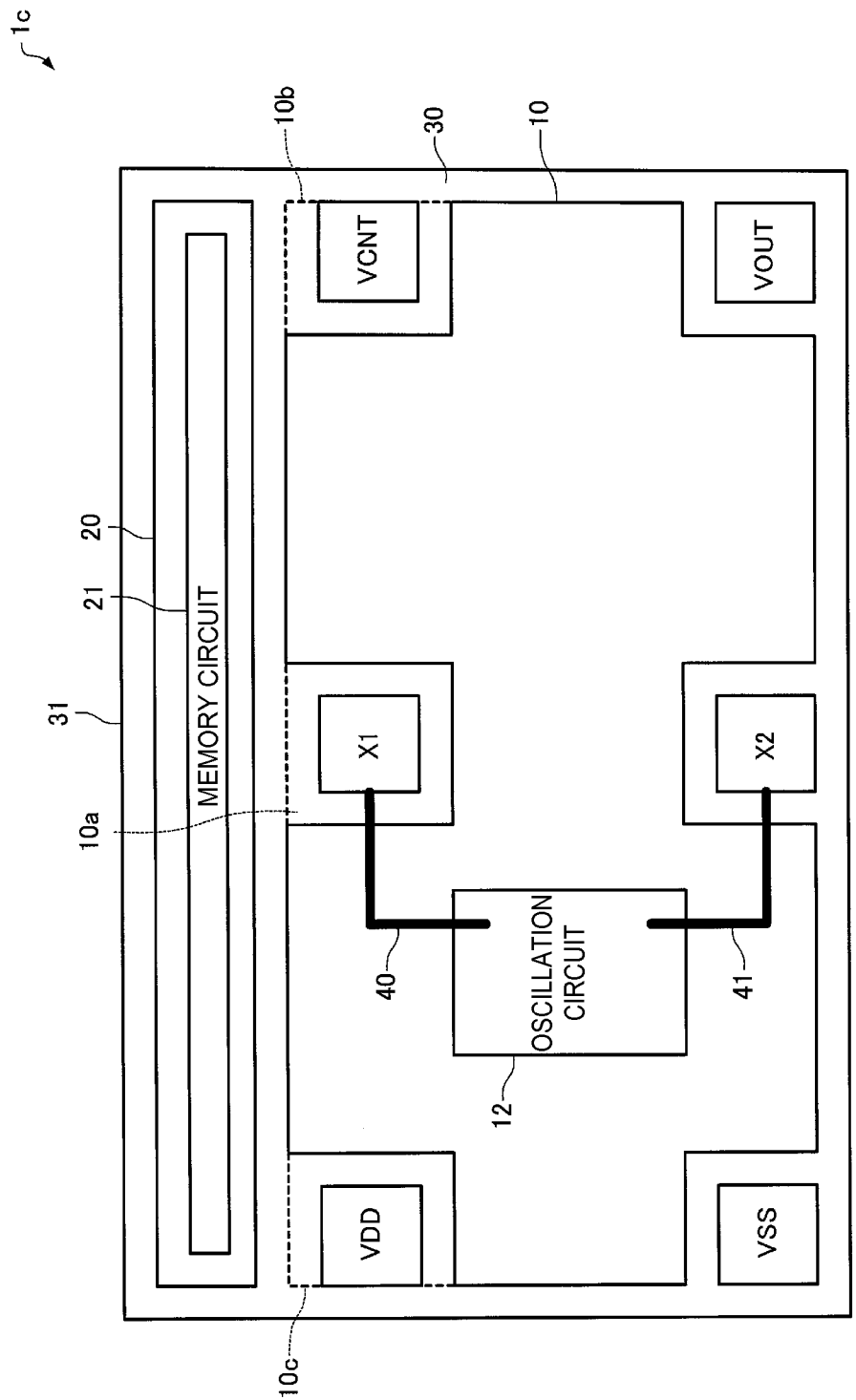
FIG. 5 is a plan view schematically showing the layout of a semiconductor circuit device according to an embodiment.

FIG. 5 is a plan view schematically showing the layout of a semiconductor circuit device 1c according to this embodiment. The circuit configuration of the semiconductor circuit device 1c is the same as the circuit configuration shown in FIG. 1. In FIG. 5, portions of circuits included in the first circuit block 10 and the second circuit block 20 are not illustrated.

In the embodiment, the connection pad VDD (an example of the second connection pad) is included, and the second circuit block 20 is provided between the edge portion 31 and the first circuit block 10 and between the edge portion 31 and the connection pad VDD in the plan view. Moreover, the second circuit block 20 is provided between the edge portion 31 and the connection pad X1 in the plan view. Moreover, the second circuit block 20 is provided between the edge portion 31 and the connection pad VCNT in the plan view.

According to the embodiment, one rectangular area much larger than that of the third embodiment can be secured in the second circuit block 20 arranged on the edge portion 31 side of the semiconductor substrate 30. Therefore, even when the size of the semiconductor substrate 30 cannot be made large, one rectangular area in the second circuit block 20 is made large, so that, for example, a large area can be secured for forming the memory circuit 21. Therefore, it is possible to realize the semiconductor circuit device 1c allowing great flexibility in circuit arrangement.

In the embodiment, the semiconductor circuit device 1c includes a recessed area 10c (a notch) in the first circuit block 10 that is recessed in the direction away from the second circuit block 20 side in the plan view. At least a portion of the connection pad VDD is provided in the recessed area 10c in the first circuit block 10. In the example shown in FIG. 5, the recessed area 10c in the first circuit block 10 is an area where a circuit element other than the connection pad VDD and a wire is not formed. In the example shown in FIG. 5, the entire connection pad VDD is provided in the recessed area 10c in the first circuit block 10 in the plan view.

According to the embodiment, one rectangular area much larger than that of the third embodiment can be secured in the second circuit block 20. Therefore, even when the size of the semiconductor substrate 30 cannot be made large, one rectangular area in the second circuit block 20 is made large, so that, for example, a large area can be secured for forming the memory circuit 21. Therefore, it is possible to realize the semiconductor circuit device 1c allowing great flexibility in circuit arrangement.

Also in the semiconductor circuit device 1c shown in FIG. 5, advantageous effects similar to those of the semiconductor circuit device 1 according to the first embodiment are provided for reasons similar to those thereof.

1-5. Fifth Embodiment

Figure 6:
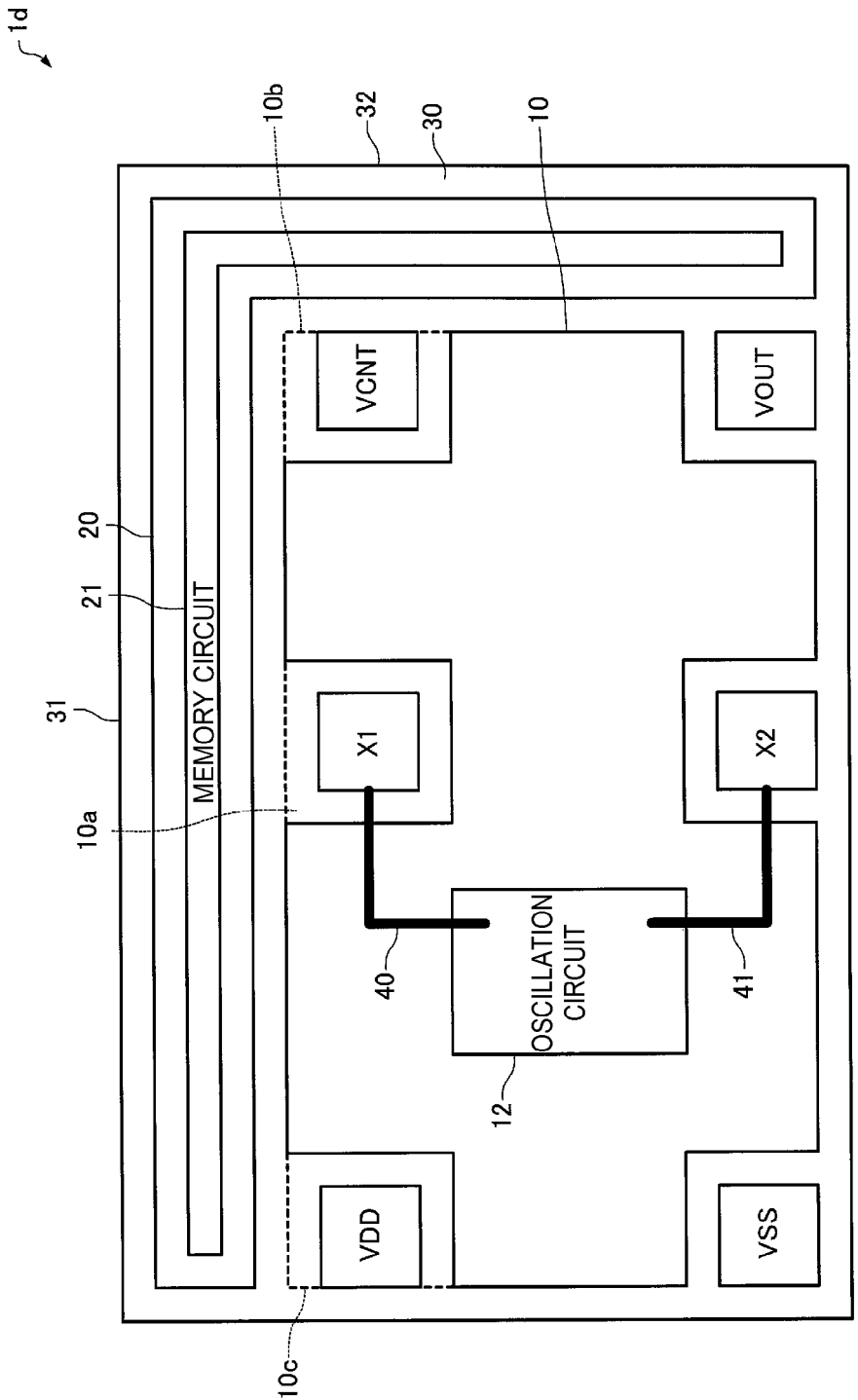
FIG. 6 is a plan view schematically showing the layout of a semiconductor circuit device according to an embodiment.

FIG. 6 is a plan view schematically showing the layout of a semiconductor circuit device 1d according to this embodiment. The circuit configuration of the semiconductor circuit device 1d is the same as the circuit configuration shown in FIG. 1. In FIG. 6, portions of circuits included in the first circuit block 10 and the second circuit block 20 are not illustrated.

In the embodiment, the second circuit block 20 is L-shaped and provided between the edge portion 31 of the semiconductor substrate 30 and the first circuit block 10, between the edge portion 31, and the first circuit block 10, the connection pad VDD, the connection pad X1, and the connection pad VCNT, between an edge portion 32 of the semiconductor substrate 30 and the first circuit block 10, and between the edge portion 32 and the connection pad VCNT. When the semiconductor substrate 30 is configured to have a polygonal shape in the plan view, the edge portion 32 may be a side different from the edge portion 31 and adjacent to the edge portion 31.

According to the embodiment, the area of the second circuit block 20 can be made much larger than that of the fourth embodiment. Therefore, even when the size of the semiconductor substrate 30 cannot be made large, one rectangular area in the second circuit block 20 is made large, so that, for example, a large area can be secured for forming the memory circuit 21. Therefore, it is possible to realize the semiconductor circuit device 1d allowing great flexibility in circuit arrangement.

Also in the semiconductor circuit device 1d shown in FIG. 6, advantageous effects similar to those of the semiconductor circuit device 1 according to the first embodiment are provided for reasons similar to those thereof.

1-6. Sixth Embodiment

Figure 7:
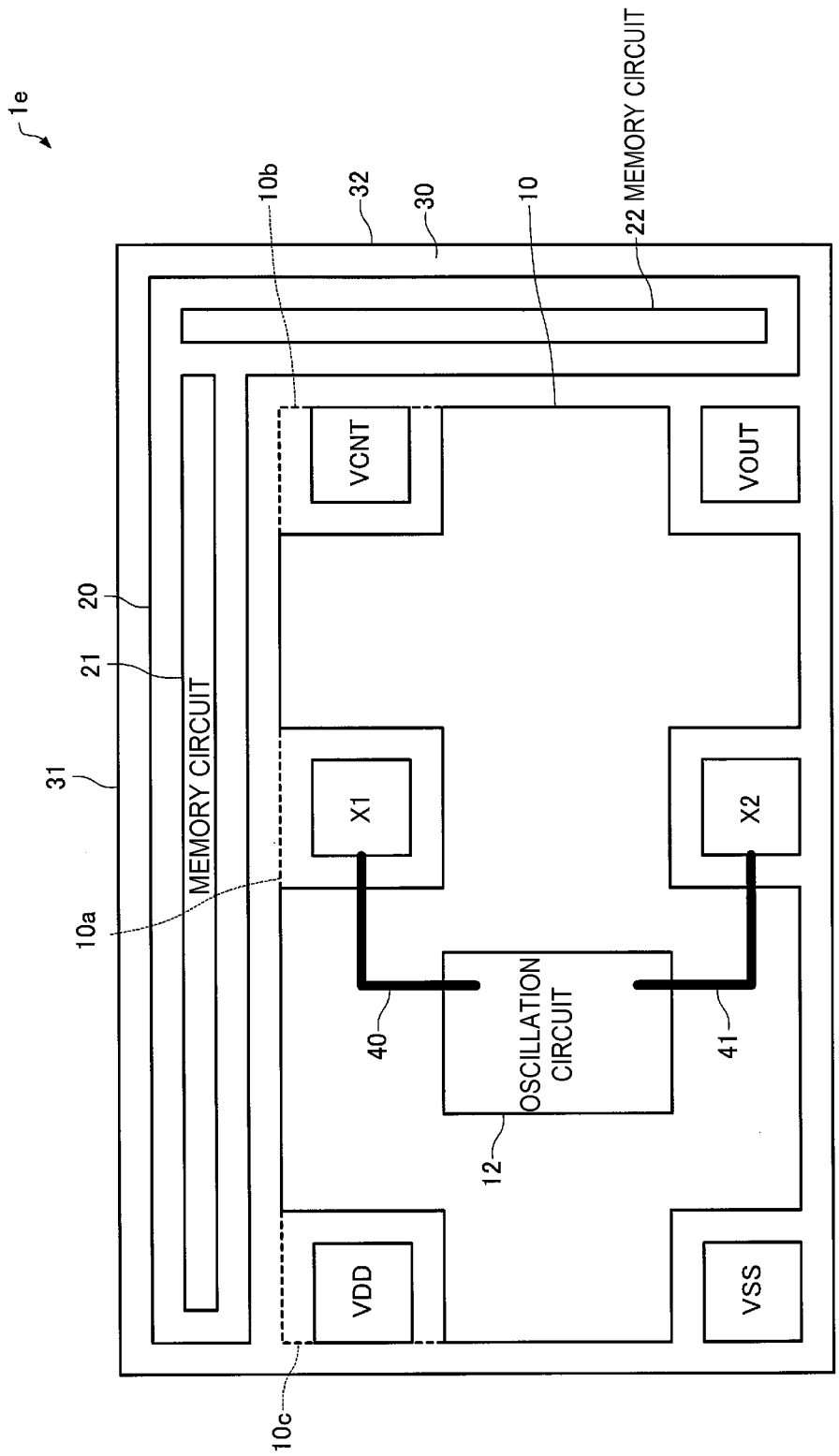
FIG. 7 is a plan view schematically showing the layout of a semiconductor circuit device according to an embodiment.

FIG. 7 is a plan view schematically showing the layout of a semiconductor circuit device 1e according to this embodiment. The circuit configuration of the semiconductor circuit device 1e is the same as the circuit configuration shown in FIG. 1 except for a memory circuit 22. In FIG. 7, portions of circuits included in the first circuit block 10 and the second circuit block 20 are not illustrated.

In the embodiment, the second circuit block 20 is configured to include the memory circuit 22, in addition to the memory circuit 21. The other configurations are the same as those of the fifth embodiment shown in FIG. 6.

Also in the semiconductor circuit device 1e shown in FIG. 7, advantageous effects similar to those of the semiconductor circuit device 1 according to the first embodiment and the semiconductor circuit device 1d according to the fifth embodiment are provided for reasons similar to those thereof.

1-7. Seventh Embodiment

Figure 8:
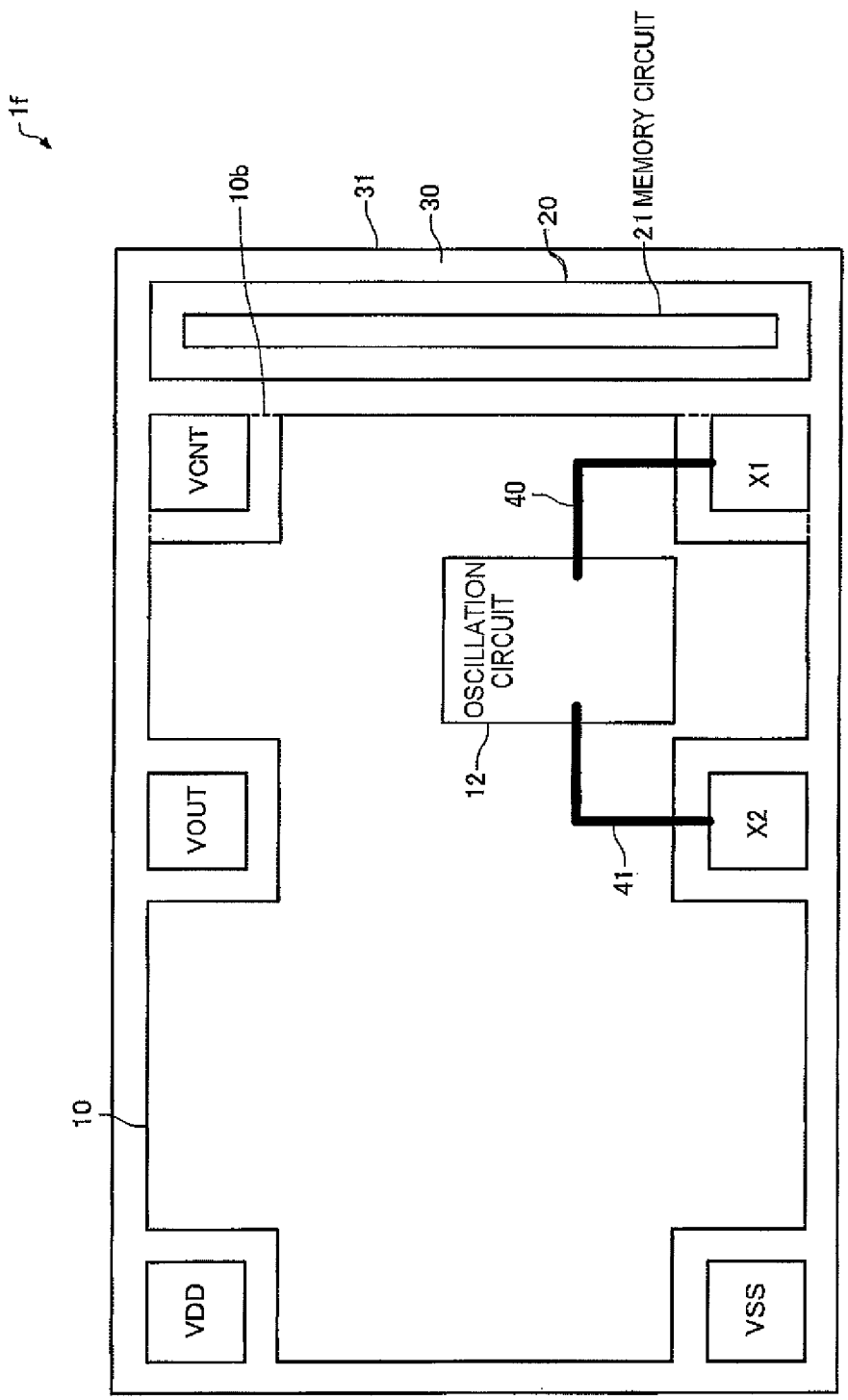
FIG. 8 is a plan view schematically showing the layout of a semiconductor circuit device according to an embodiment.

FIG. 8 is a plan view schematically showing the layout of a semiconductor circuit device 1f according to this embodiment. The circuit configuration of the semiconductor circuit device 1f is the same as the circuit configuration shown in FIG. 1. In FIG. 8, portions of circuits included in the first circuit block 10 and the second circuit block 20 are not illustrated.

In the embodiment, the second circuit block 20 is provided so as to be along the short side of the semiconductor substrate 30. Also in such a configuration, advantageous effects similar to those of the semiconductor circuit device 1 according to the first embodiment are provided for reasons similar to those thereof.

2. Oscillator

Figure 9:
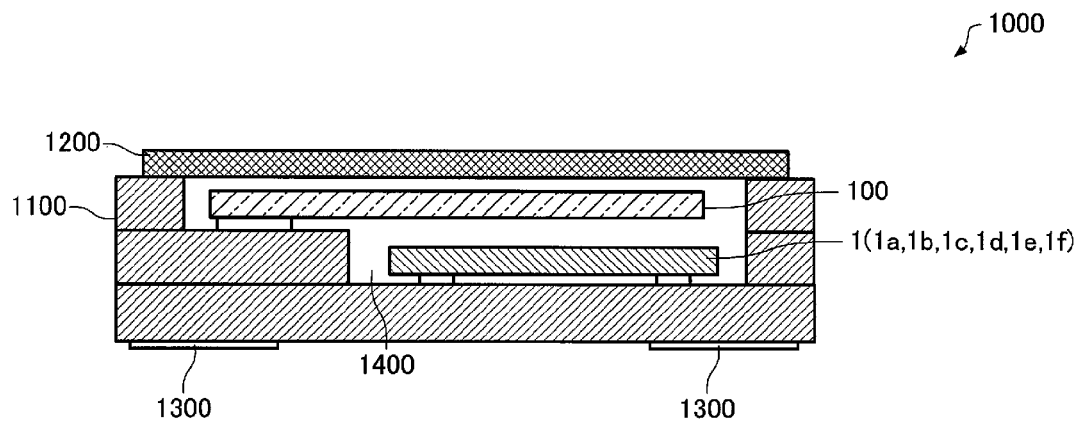
FIG. 9 is a cross-sectional view schematically showing an oscillator according to an embodiment.

FIG. 9 is a cross-sectional view schematically showing an oscillator 1000 as an example of an electronic device according to this embodiment. The oscillator 1000 is configured to include the semiconductor circuit device 1 and the vibrator 100 as a resonator. As described above, the first circuit block 10 of the semiconductor circuit device 1 is configured to include the oscillation circuit 12. Moreover, in the example shown in FIG. 9, the oscillator 1000 is configured to include a package 1100 that accommodates the semiconductor circuit device 1 and the vibrator 100 in the same space. Moreover, in the example shown in FIG. 9, the oscillator 1000 is configured to include a lid 1200 and electrodes 1300. In the example shown in FIG. 9, the semiconductor circuit device 1 is made into one chip. The vibrator 100 may be a quartz crystal resonator using quartz crystal as a substrate material, for example an AT cut or SC cut quartz crystal resonator, a SAW (Surface Acoustic Wave) resonator, or a MEMS (Micro Electro Mechanical Systems) vibrator. As the substrate material of the vibrator 100, piezoelectric single crystal such as of lithium tantalate or lithium niobate, a piezoelectric material such as piezoelectric ceramics such as lead zirconate titanate, a silicon semiconductor material, or the like can be used other than quartz crystal. As a means of exciting the vibrator 100, one using a piezoelectric effect may be used, or electrostatic drive using the Coulomb force may be used. Further, instead of the vibrator 100, an optical resonator using a gas cell containing alkali metal or the like therein and light interacting with the atoms of the alkali metal or the like, a cavity resonator or dielectric resonator that resonates in the microwave region, an LC resonator, or the like can also be used.

The package 1100 is provided with a recess. The recess is covered with the lid 1200 to thereby form an accommodating chamber 1400. In the package 1100, wires and terminals for electrically connecting the semiconductor circuit device 1 with the vibrator 100 are provided on a surface of the recess or in the interior of the package 1100. Moreover, the package 1100 is provided with at least the electrodes 1300 electrically connected respectively with the connection pad VDD, the connection pad VSS, the connection pad VCNT, and the connection pad VOUT of the semiconductor circuit device 1.

Figure 10:
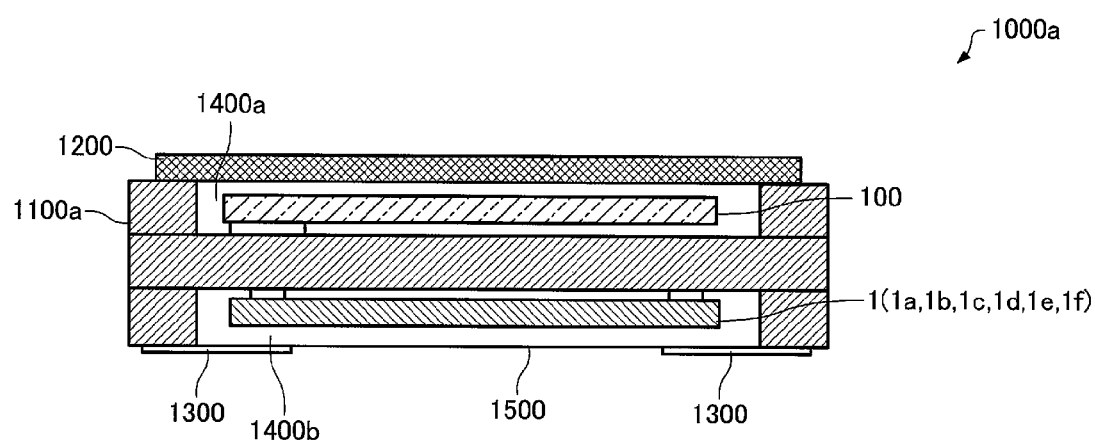
FIG. 10 is a cross-sectional view schematically showing an oscillator according to a modified example.

FIG. 10 is a cross-sectional view schematically showing an oscillator 1000a according to a modified example. The oscillator 1000a is configured to include the semiconductor circuit device 1 and the vibrator 100. In the example shown in FIG. 10, the oscillator 1000a is configured to include a package 1100a that accommodates the semiconductor circuit device 1 and the vibrator 100 in different spaces. Moreover, in the example shown in FIG. 10, the oscillator 1000a is configured to include the lid 1200, the electrodes 1300, and a sealing member 1500. In the example shown in FIG. 10, the semiconductor circuit device 1 is made into one chip. The vibrator 100 may be a quartz crystal resonator using quartz crystal as a substrate material, for example an AT cut or SC cut quartz crystal resonator, a SAW (Surface Acoustic Wave) resonator, or a MEMS (Micro Electro Mechanical Systems) vibrator. As the substrate material of the vibrator 100, piezoelectric single crystal such as of lithium tantalate or lithium niobate, a piezoelectric material such as piezoelectric ceramics such as lead zirconate titanate, a silicon semiconductor material, or the like can be used other than quartz crystal. As a means of exciting the vibrator 100, one using a piezoelectric effect may be used, or electrostatic drive using the Coulomb force may be used.

In the package 1100a, two recesses are provided in surfaces opposing to each other. One of the recesses is covered with the lid 1200 to thereby form an accommodating chamber 1400a, while the other recess is covered with the sealing member 1500 to thereby form an accommodating chamber 1400b. In the example shown in FIG. 10, the vibrator 100 is accommodated in the accommodating chamber 1400a, while the semiconductor circuit device 1 is accommodated in the accommodating chamber 1400b. In the package 1100a, wires and terminals for electrically connecting the semiconductor circuit device 1 with the vibrator 100 are provided on surfaces of the recesses or in the interior of the package 1100a. Moreover, the package 1100a is provided with at least the electrodes 1300 electrically connected respectively with the connection pad VDD, the connection pad VSS, the connection pad VCNT, and the connection pad VOUT of the semiconductor circuit device 1.

According to the oscillator 1000 and the oscillator 1000*a* according to the embodiment, since the semiconductor circuit device 1 capable of suppressing the interference between the connection wire 40 and the second circuit block 20 is included, it is possible to realize the oscillator 1000 and the oscillator 1000*a* having high operational reliability. Moreover, according to the oscillator 1000 and the oscillator 1000*a* according to the embodiment, the semiconductor circuit device 1 allowing great flexibility in circuit arrangement is included. The semiconductor circuit device 1 allows the great flexibility because even when the size of the semiconductor substrate 30 cannot be made large, one rectangular area in the second circuit block 20 is made large, so that, for example, a large area can be secured for forming the memory circuit 21. Therefore, it is possible to realize the oscillator 1000 and the oscillator 1000*a* suitable for miniaturization. Also when the semiconductor circuit device 1*a*, the semiconductor circuit device 1*b*, the semiconductor circuit device 1*c*, the semiconductor circuit device 1*d*, the semiconductor circuit device 1*e*, or the semiconductor circuit device 1*f* is adopted instead of the semiconductor circuit device 1, similar advantageous effects are provided for similar reasons. Moreover, the electronic device is not limited to the above-described examples, but may be, for example, an atomic oscillator, a microwave oscillator, an LC oscillator, or the like, using the semiconductor circuit device 1, the semiconductor circuit device 1*a*, the semiconductor circuit device 1*b*, the semiconductor circuit device 1*c*, the semiconductor circuit device 1*d*, the semiconductor circuit device 1*e*, or the semiconductor circuit device 1*f* according to the invention and an optical resonator, a microwave resonator, or an LC resonator. Further, the electronic device may be an inertial sensor such as an acceleration sensor or a gyro sensor and a force sensor such as an inclination sensor, using the semiconductor circuit device 1, the semiconductor circuit device 1*a*, the semiconductor circuit device 1*b*, the semiconductor circuit device 1*c*, the semiconductor circuit device 1*d*, the semiconductor circuit device 1*e*, or the semiconductor circuit device 1*f* according to the invention.

3. Electronic Apparatus

Figure 11:
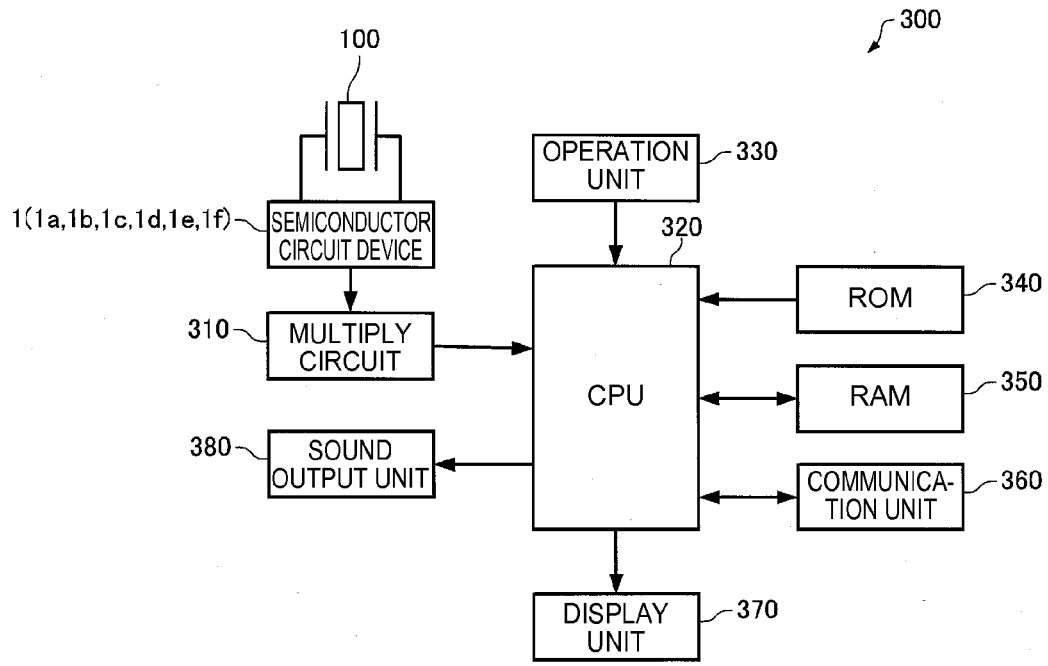
FIG. 11 is a functional block diagram of an electronic apparatus according to an embodiment.

FIG. 11 is a functional block diagram of an electronic apparatus 300 according to this embodiment. Configurations similar to those of the embodiments described above are denoted by the same reference numerals and signs, and a detailed description thereof is omitted.

The electronic apparatus 300 according to the embodiment is the electronic apparatus 300 including the semiconductor circuit device 1, the semiconductor circuit device 1*a*, the semiconductor circuit device 1*b*, the semiconductor circuit device 1*c*, the semiconductor circuit device 1*d*, the semiconductor circuit device 1*e*, the semiconductor circuit device 1*f*, the oscillator 1000, or the oscillator 1000*a*. In the example shown in FIG. 11, the electronic apparatus 300 is configured to include the vibrator 100, the semiconductor circuit device 1, a multiply circuit 310, a CPU (Central Processing Unit) 320, an operation unit 330, a ROM (Read Only Memory) 340, a RAM (Random Access Memory) 350, a communication unit 360, a display unit 370, and a sound output unit 380. In the electronic apparatus 300 according to the embodiment, a portion of the components (parts) shown in FIG. 11 may be omitted or changed, or a configuration to which another component is added may be adopted.

The multiply circuit 310 supplies a clock pulse not only to the CPU 320 but to the parts (not shown in the drawing). The clock pulse may be, for example, a signal obtained by extracting with the multiply circuit 310 a desired harmonic signal from an oscillation signal from the semiconductor circuit device 1 connected with the vibrator 100, or may be a signal obtained by multiplying the oscillation signal from the semiconductor circuit device 1 with the multiply circuit 310 including a PLL synthesizer (not shown in the drawing).

The CPU 320 performs, according to programs stored in the ROM 340 or the like, various kinds of computing processing or control processing using the clock pulse output by the multiply circuit 310. Specifically, the CPU 320 performs various kinds of processing according to an operation signal from the operation unit 330, processing for controlling the communication unit 360 for performing data communication with the outside, processing for transmitting a display signal for causing the display unit 370 to display various kinds of information, processing for causing the sound output unit 380 to output various kinds of sounds, and the like.

The operation unit 330 is an input device composed of an operating key, a button switch, and the like, and outputs an operation signal according to a user's operation to the CPU 320.

The ROM 340 stores programs, data, and the like for the CPU 320 to perform various kinds of computing processing or control processing.

The RAM 350 is used as a working area of the CPU 320, and temporarily stores programs or data read from the ROM 340, data input from the operation unit 330, the results of operations executed by the CPU 320 according to various kinds of programs, and the like.

The communication unit 360 performs various kinds of controls for establishing data communication between the CPU 320 and an external device.

The display unit 370 is a display device composed of an LCD (Liquid Crystal Display), an electrophoretic display, or the like, and displays various kinds of information based on the display signal input from the CPU 320.

The sound output unit 380 is a device that outputs sounds, such as a speaker.

According to the electronic apparatus 300 according to the embodiment, since the semiconductor circuit device 1 capable of suppressing the interference between the connection wire 40 and the second circuit block 20 is included, it is possible to realize the electronic apparatus 300 having high operational reliability. Moreover, according to the electronic apparatus 300 according to the embodiment, the semiconductor circuit device 1 allowing great flexibility in circuit arrangement is included. The semiconductor circuit device 1 allows the great flexibility because even when the size of the semiconductor substrate 30 cannot be made large, one rectangular area in the second circuit block 20 is made large, so that, for example, a large area can be secured for forming the memory circuit 21. Therefore, it is possible to realize the electronic apparatus 300 suitable for miniaturization. Also when the semiconductor circuit device 1*a*, the semiconductor circuit device 1*b*, the semiconductor circuit device 1*c*, the semiconductor circuit device 1*d*, the semiconductor circuit device 1*e*, the semiconductor circuit device 1*f*, the oscillator 1000, or the oscillator 1000*a* is adopted instead of the semiconductor circuit device 1, similar advantageous effects are provided for similar reasons.

As the electronic apparatus 300, various kinds of electronic apparatuses are considered. For example, examples thereof include personal computers (for example, mobile personal computers, laptop personal computers, and tablet personal computers), mobile terminals such as mobile phones, digital still cameras, inkjet ejection apparatuses (for example, inkjet printers), storage area network apparatuses such as routers or switches, local area network apparatuses, apparatuses for mobile terminal base station, television sets, video camcorders, video recorders, car navigation systems, pagers, electronic notebooks (including those with communication function), electronic dictionaries, calculators, electronic gaming machines, game controllers, word processors, workstations, videophones, surveillance television monitors, electronic binoculars, POS (point of sale) terminals, medical devices (for example, electronic thermometers, sphygmomanometers, blood glucose meters, electrocardiogram measuring systems, ultrasonic diagnosis apparatuses, and electronic endoscopes), fishfinders, various kinds of measuring instrument, indicators (for example, indicators used in vehicles, aircraft, and ships), flight simulators, head-mounted displays, motion tracing, motion tracking, motion controllers, and PDR (pedestrian dead reckoning).

Figure 12:
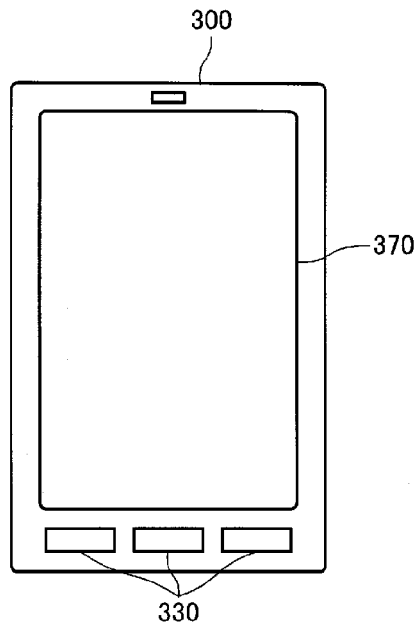
FIG. 12 is a diagram showing an example of the appearance of a smartphone as an example of the electronic apparatus.

FIG. 12 is a diagram showing an example of the appearance of a smartphone as an example of the electronic apparatus 300. The smartphone as the electronic apparatus 300 includes buttons as the operation units 330, and an LCD as the display unit 370. Since the smartphone as the electronic apparatus 300 includes the semiconductor circuit device 1, the semiconductor circuit device 1a, the semiconductor circuit device 1b, the semiconductor circuit device 1c, the semiconductor circuit device 1d, the semiconductor circuit device 1e, the semiconductor circuit device 1f, the oscillator 1000, or the oscillator 1000a, it is possible to realize the electronic apparatus 300 having high operational reliability. Moreover, it is possible to realize the electronic apparatus 300 suitable for miniaturization.

4. Moving Object

Figure 13:
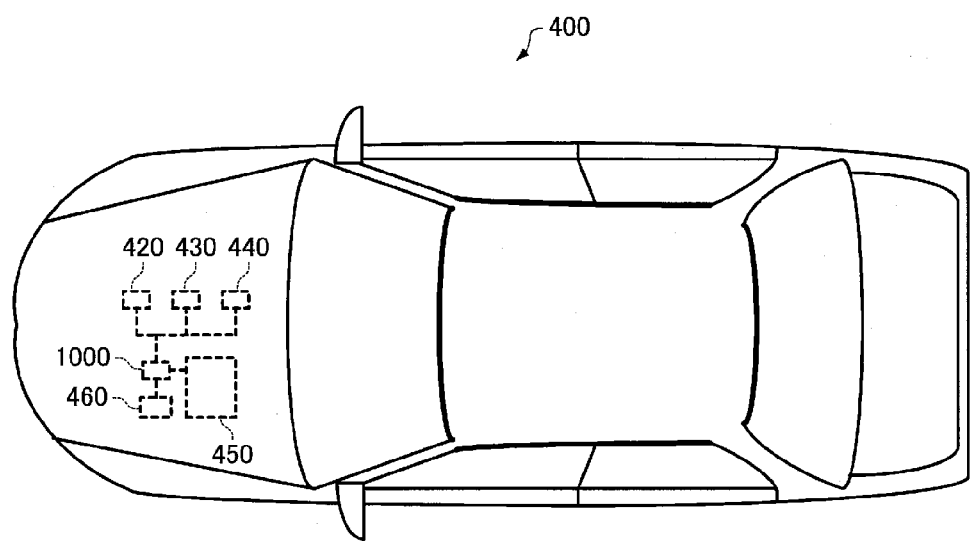
FIG. 13 is a diagram (top view) showing an example of a moving object according to an embodiment.

FIG. 13 is a diagram (top view) showing an example of a moving object 400 according to this embodiment. Configurations similar to those of the embodiments described above are denoted by the same reference numerals and signs, and a detailed description thereof is omitted.

The moving object 400 according to the embodiment is the moving object 400 including the semiconductor circuit device 1, the semiconductor circuit device 1a, the semiconductor circuit device 1b, the semiconductor circuit device 1c, the semiconductor circuit device 1d, the semiconductor circuit device 1e, the semiconductor circuit device 1f, the oscillator 1000, or the oscillator 1000a. In FIG. 13, the moving object 400 including the oscillator 1000 is shown. In the example shown in FIG. 13, the moving object 400 is configured to include controllers 420, 430, and 440 that perform various kinds of controls for an engine system, a brake system, a keyless entry system, and the like, a battery 450, and a backup battery 460. In the moving object 400 according to the embodiment, a portion of the components (parts) shown in FIG. 13 may be omitted or changed, or a configuration to which another component is added may be adopted.

According to the moving object 400 according to the embodiment, since the oscillator 1000 including the semiconductor circuit device 1 capable of suppressing the interference between the connection wire 40 and the second circuit block 20 is included, it is possible to realize the moving object 400 having high operational reliability. Moreover, according to the moving object 400 according to the embodiment, the oscillator 1000 including the semiconductor circuit device 1 allowing great flexibility in circuit arrangement is included. The semiconductor circuit device 1 allows the great flexibility because even when the size of the semiconductor substrate 30 cannot be made large, one rectangular area in the second circuit block 20 is made large, so that, for example, a large area can be secured for forming the memory circuit 21. Therefore, it is possible to realize the moving object 400 suitable for miniaturization. Also when the semiconductor circuit device 1, the semiconductor circuit device 1a, the semiconductor circuit device 1b, the semiconductor circuit device 1c, the semiconductor circuit device 1d, the semiconductor circuit device 1e, the semiconductor circuit device 1f, or the oscillator 1000a is adopted instead of the oscillator 1000, similar advantageous effects are provided for similar reasons.

As the moving object 400, various kinds of moving objects are considered. For example, examples thereof include automobiles (including electric automobiles), aircraft such as jets or helicopters, ships, rockets, and artificial satellites.

Although the embodiments or modified example have been described above, the invention is not limited to the embodiments or modified example. The invention can be implemented in various forms within the scope not departing from the gist thereof.

The invention includes a configuration (for example, a configuration having the same function, method, and result, or a configuration having the same advantage and effect) that is substantially the same as those described in the embodiments. Moreover, the invention includes a configuration in which a non-essential portion of the configurations described in the embodiments is replaced. Moreover, the invention includes a configuration providing the same operational effects as those described in the embodiments, or a configuration capable of achieving the same advantages. Moreover, the invention includes a configuration in which a publicly known technique is added to the configurations described in the embodiments.

The entire disclosure of Japanese Patent Application No. 2013-231552 filed Nov. 7, 2013 is hereby expressly incorporated by reference.

What is claimed is:

1. A semiconductor circuit device comprising:
a semiconductor substrate;
a first circuit block on the semiconductor substrate, the first circuit block including an analog circuit;
a second circuit block on the semiconductor substrate, the second circuit block including a digital circuit;
a connection pad on the semiconductor substrate; and
a connection wire on the semiconductor substrate, the connection wire electrically connecting the connection pad with the first circuit block, wherein
an entirety of the connection wire is laterally spaced apart from the second circuit block in a plan view,
the connection pad is laterally shifted from a peripheral of the semiconductor substrate via the second circuit block in the plan view,
the connection pad is electrically connected to a resonator located outside of the semiconductor substrate,
the connection pad is provided between the first circuit block and the second circuit block in the plan view, and
at least a portion of the connection pad is arranged in a recessed area of the first circuit block in the plan view.

2. The semiconductor circuit device according to claim 1, wherein
the second circuit block includes a memory circuit.

3. The semiconductor circuit device according to claim 1, wherein the first circuit block includes an oscillation circuit electrically connected with the connection wire, and the oscillation circuit drives the resonator via the connection pad.

4. The semiconductor circuit device according to claim 3, wherein
the connection pad is electrically connected with a terminal to which an oscillation signal is output from the oscillation circuit via the connection wire.

5. An electronic device comprising:
a package; and
the semiconductor circuit device according to claim 1 housed by the package.

6. A semiconductor circuit device comprising:
a semiconductor substrate;
a first circuit block on the semiconductor substrate, the first circuit block including an analog circuit;
a second circuit block on the semiconductor substrate, the second circuit block including a digital circuit; and
a first connection pad on the semiconductor substrate, wherein
the first connection pad is provided between the first circuit block and the second circuit block in a plan view so that the first connection pad is laterally shifted from a peripheral of the semiconductor substrate via the second circuit block in the plan view,
the first connection pad is electrically connected to a resonator located outside of the semiconductor substrate, and
at least a portion of the first connection pad is arranged in a recessed area of the first circuit block in the plan view.

7. The semiconductor circuit device according to claim 6, further comprising:
a second connection pad provided between the first circuit block and the second circuit block in the plan view.

8. The semiconductor circuit device according to claim 6, wherein
the second circuit block is provided between the peripheral of the semiconductor substrate and the first circuit block and between the peripheral and the first connection pad.

9. The semiconductor circuit device according to claim 8, further comprising:
a second connection pad, wherein
the second circuit block is provided between the peripheral and the second connection pad in the plan view.

10. The semiconductor circuit device according to claim 6, wherein
the second circuit block includes a memory circuit.

11. An electronic device comprising:
a package; and
the semiconductor circuit device according to claim 6 housed by the package.

12. A semiconductor circuit device comprising:
a semiconductor substrate;
a first circuit block on the semiconductor substrate, the first block including an analog circuit;
a second circuit block on the semiconductor substrate, the second circuit block including a digital circuit, the second circuit block being physically isolated from the first circuit block by part of the substrate in a plan view;
a first connection pad on the semiconductor substrate, the first connection pad being provided between the first circuit block and the second circuit block in the plan view, and at least a portion of the first connection pad being arranged in a recessed area of the first circuit block in the plan view; and
a connection wire on the semiconductor substrate, the connection wire electrically connecting the first connection pad with the first circuit block, an entirety of the connection wire being laterally spaced apart from the second circuit block in the plan view, wherein
the first connection pad is laterally shifted from a peripheral of the semiconductor substrate via the second circuit block in the plan view, and
the first connection pad is electrically connected to a resonator located outside of the semiconductor substrate.

13. The semiconductor circuit device according to claim 12, wherein
the digital circuit is a memory circuit.

14. The semiconductor circuit device according to claim 12, wherein
the analog circuit is an oscillation circuit electrically connected to the connection wire.

15. The semiconductor circuit device according to claim 12, further comprising:
a second connection pad provided between the first circuit block and the second circuit block in the plan view.

16. The semiconductor circuit device according to claim 12, wherein
the second circuit block is provided between the peripheral of the semiconductor substrate and the first circuit block and between the peripheral and the first connection pad.

* * * * *